United States Patent
Yeh et al.

(10) Patent No.: US 9,490,134 B2
(45) Date of Patent: Nov. 8, 2016

(54) TERMINATION STRUCTURE OF SEMICONDUCTOR DEVICE AND METHOD FOR MANUFACTURING THE SAME

(71) Applicant: SUPER GROUP SEMICONDUCTOR CO., LTD., New Taipei (TW)

(72) Inventors: Chun-Ying Yeh, Hsinchu (TW); Yuan-Ming Lee, Taichung (TW)

(73) Assignee: SUPER GROUP SEMICONDUCTOR CO., LTD., New Taipei (TW)

( * ) Notice: Subject to any disclaimer, the term of this patent is extended or adjusted under 35 U.S.C. 154(b) by 0 days.

(21) Appl. No.: 14/629,498

(22) Filed: Feb. 24, 2015

(65) Prior Publication Data
US 2015/0333132 A1 Nov. 19, 2015

(30) Foreign Application Priority Data
May 13, 2014 (TW) .............................. 103116861 A

(51) Int. Cl.
| | | |
|---|---|---|
| H01L 29/40 | (2006.01) | |
| H01L 21/306 | (2006.01) | |
| H01L 29/66 | (2006.01) | |
| H01L 29/872 | (2006.01) | |
| H01L 29/06 | (2006.01) | |
| H01L 29/739 | (2006.01) | |

(52) U.S. Cl.
CPC ....... *H01L 21/306* (2013.01); *H01L 21/30604* (2013.01); *H01L 29/0619* (2013.01); *H01L 29/0649* (2013.01); *H01L 29/402* (2013.01); *H01L 29/404* (2013.01); *H01L 29/407* (2013.01); *H01L 29/66143* (2013.01); *H01L 29/8725* (2013.01); *H01L 29/66348* (2013.01); *H01L 29/7397* (2013.01)

(58) Field of Classification Search
CPC ........... H01L 29/404; H01L 21/30604; H01L 29/407; H01L 29/872; H01L 21/26586; H01L 29/0661; H01L 29/8725
USPC .......................................... 257/488; 438/454
See application file for complete search history.

(56) References Cited

U.S. PATENT DOCUMENTS

| | | | | |
|---|---|---|---|---|
| 8,912,621 B1* | 12/2014 | Chuang | ................. | H01L 29/872 257/471 |
| 2013/0270668 A1* | 10/2013 | Huang | .................. | H01L 29/872 257/471 |
| 2014/0175457 A1* | 6/2014 | Yen | ...................... | H01L 29/8725 257/77 |

FOREIGN PATENT DOCUMENTS

| | | |
|---|---|---|
| TW | 200425509 A | 11/2004 |
| TW | M449354 U | 3/2013 |
| TW | 201336080 A | 9/2013 |
| TW | 201347180 A | 11/2013 |
| TW | M464821 U | 11/2013 |

* cited by examiner

*Primary Examiner* — Walter H Swanson
(74) *Attorney, Agent, or Firm* — CKC & Partners Co., Ltd.

(57) ABSTRACT

A termination structure of a semiconductor device is provided. The semiconductor device includes an active area and a termination area adjacent to the active area, in which the termination area has the termination structure. The termination structure includes a substrate, an epitaxy layer, a dielectric layer, a conductive material layer and a conductive layer. The epitaxy layer is disposed on the substrate and has a voltage-sustaining region. The voltage-sustaining region has trenches parallel to each other. The dielectric layer is disposed in the trenches and on a portion of the epitaxy layer. The conductive material layer is disposed on the dielectric layer in the trenches. The conductive layer covers the trenches, and is in contact with the conductive material layer and a portion of the epitaxy layer, and is electrically connected between the active area and the termination area. A method for manufacturing the termination structure is also provided.

8 Claims, 11 Drawing Sheets

US 9,490,134 B2

1

TERMINATION STRUCTURE OF SEMICONDUCTOR DEVICE AND METHOD FOR MANUFACTURING THE SAME

RELATED APPLICATIONS

This application claims priority to Taiwan Application Serial Number 103116861 filed May 13, 2014, which is herein incorporated by reference.

BACKGROUND

1. Field of Invention

The present disclosure relates to a termination structure of a semiconductor device. More particularly, the present disclosure relates to a termination structure having a plurality of trenches and a method for manufacturing the same.

2. Description of Related Art

A voltage sustaining capability is a very important factor for a power semiconductor device. For example, because a trench field effect transistor generally has characteristics such as a high voltage sustaining capability, a low conducting resistance and a high current, the trench field effect transistor is widely used as the power semiconductor device in a power managing device.

Many complicated photomask processes are generally required for manufacturing the trench field effect transistor, thus increasing processing time and pollution probability, such that the yield and production capacity of the power semiconductor device are limited.

On the other hand, the trench field effect transistor generally has a larger area of termination structure for increasing a breakdown voltage. However, this type of the termination structure with a large area is outdated for a miniaturization trend of electronic devices.

SUMMARY

One embodiment of the present disclosure is to provide a termination structure of a semiconductor device. The semiconductor device includes an active area and a termination area adjacent to the active area. The termination area has the termination structure, and the termination structure includes a substrate, an epitaxy layer, a dielectric layer, a conductive material layer and a conductive layer.

The epitaxy layer is disposed on the substrate, and has a voltage-sustaining region. The voltage-sustaining region has first trenches extending along a first direction. The dielectric layer is disposed in each of the first trenches and on a first portion of the epitaxy layer. The conductive material layer is disposed on the dielectric layer in each of the first trenches. The conductive layer covers each of the first trenches, and is in contact with the conductive material layer and a second portion of the epitaxy layer, and is electronically connected to the active area.

Another embodiment of the present disclosure is to provide a method for manufacturing a termination structure of a semiconductor device. The semiconductor device includes an active area and a termination area. The termination area is adjacent to the active area and has the termination structure. The method includes following steps. An epitaxy layer is formed on a substrate, in which the epitaxy layer has a voltage-sustaining region. Trenches are formed in the voltage-sustaining region of the epitaxy layer, in which the trenches extend along a first direction and are parallel with each other. A dielectric layer is formed in each of the trenches. A conductive material layer is formed on the

2 dielectric layer in each of the trenches and on a first portion of the epitaxy layer. A conductive layer is formed on each of the trenches, in which the conductive layer is in contact with the conductive material layer and a second portion of the epitaxy layer.

Since the dielectric layers in the trenches are connected to each other, it has a higher breakdown voltage in a smaller area by increasing the trench structure. Therefore, the termination structure of the semiconductor device provided in the present disclosure can significantly increase the breakdown voltage of the overall semiconductor device.

BRIEF DESCRIPTION OF THE DRAWINGS

The present disclosure can be more fully understood by reading the following detailed description of the embodiment, with reference made to the accompanying drawings as follows.

DETAILED DESCRIPTION

Specific embodiments of the present disclosure are further described in detail below with reference to the accompanying drawings, however, the embodiments described are not intended to limit the present disclosure and it is not intended for the description of operation to limit the order of implementation. Moreover, any device with equivalent functions that is produced from a structure formed by a recombination of elements shall fall within the scope of the present disclosure. Additionally, the drawings are only illustrative and are not drawn to actual size.

The present disclosure provides a termination structure of a semiconductor device and a method for manufacturing the same that can be applied in a trench power semiconductor device such as a trench metal oxide semiconductor Schottky barrier diodes (TMBS diode), a trench insulated gate bipolar transistor (Trench IGBT) or a trench power metal oxide semiconductor field effect transistor (Trench Power MOSFET). Several embodiments will be provided to describe the termination structure of the semiconductor device and the method for manufacturing it in the present disclosure.

Figure 1A:
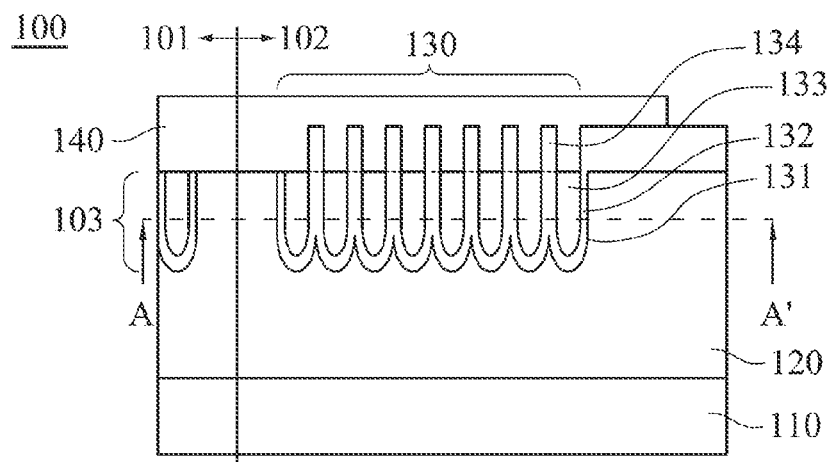
FIG. 1A is a cross-sectional view of a semiconductor device 100 according to an embodiment of the present disclosure.

FIG. 1A is a cross-sectional view of a semiconductor device 100 according to an embodiment of the present disclosure. In FIG. 1A, the semiconductor device 100 includes an active area 101 and a termination area 102 adjacent to the active area 101. The termination area 102 has a termination structure including a substrate 110, an epitaxy layer 120, a dielectric layer 132, a conductive material layer 133 and a conductive layer 140.

The epitaxy layer 120 is disposed on the substrate 110, and has a voltage-sustaining region 130. The voltage-sustaining region 130 is disposed near a trench semiconductor unit 103 in the active area 101, and has first trenches 131. According to an embodiment of the present disclosure, the substrate 110 may be a silicon substrate. According to an embodiment of the present disclosure, the epitaxy layer 120 can be a N-type epitaxy layer. According to an embodiment of the present disclosure, widths of the first trenches 131 may be different. According to an embodiment of the present disclosure, the widths of the first trenches 131 may be progressively wider or progressively narrower.

The dielectric layer 132 is disposed in each of the first trenches 131 and on a first portion of the epitaxy layer 120. According to an embodiment of the present disclosure, the dielectric layer 132 is constituted by oxide. According to an embodiment of the present disclosure, the dielectric layers 132 in every two adjacent first trenches 131 are in contact with each other.

The conductive material layer 133 is disposed on the dielectric layer 132 in each of the first trenches 131. According to an embodiment of the present disclosure, the conductive material layer 133 is constituted by polysilicon or metal. Widths of the dielectric layer 132 and the conductive material layer 133 can be adjusted proportionally according to a practical withstand voltage requirement.

The conductive layer 140 covers the first trenches 131, and is in contact with the conductive material layer 133 and a second portion of the epitaxy layer 120, and is electronically connected to the active area 101 and the termination area 102. According to an embodiment of the present disclosure, the conductive layer 140 is a Schottky barrier metal layer.

According to an embodiment of the present disclosure, the termination structure further includes a second dielectric layer disposed between the conductive layer and a portion of the conductive material layer. The second dielectric layer enables the conductive layer to be electronically connected to the conductive material layer in a portion of the first trenches. Since an internal dielectric layer is disposed between the conductive layer and a portion of the conductive material layer, it enables the conductive material layer to have different electric potentials and to provide an effect of different withstand voltages.

Figure 1B:
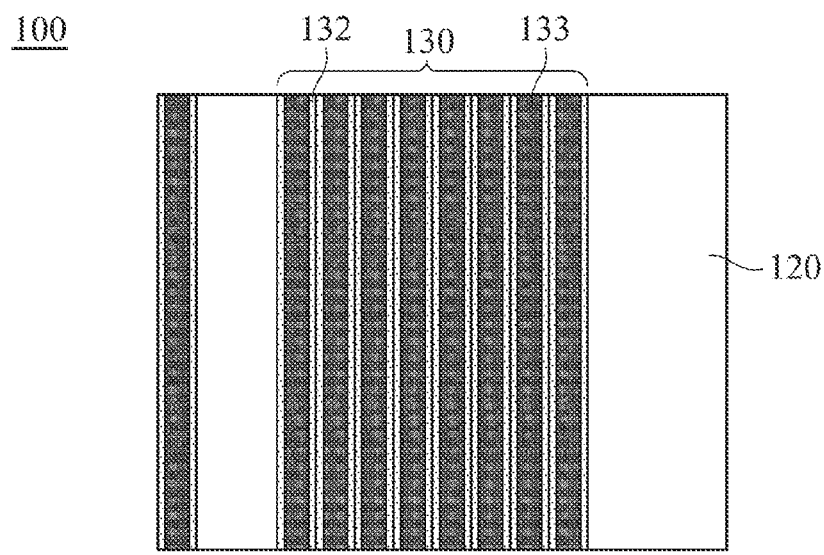
FIG. 1B is a cross-sectional top view of the semiconductor device in FIG. 1A along a cross-sectional line A-A' according to an embodiment of the present disclosure.

FIG. 1B is a cross-sectional top view of the semiconductor device in FIG. 1A along a cross-sectional line A-A' according to an embodiment of the present disclosure. In FIG. 1B, the voltage-sustaining region 130 of the epitaxy layer 120 in the termination structure has the first trenches 131. The first trench 131 extend along a direction and are parallel with each other. The dielectric layer 132 and the conductive material layer 133 are disposed in the first trenches 131.

Figure 2:
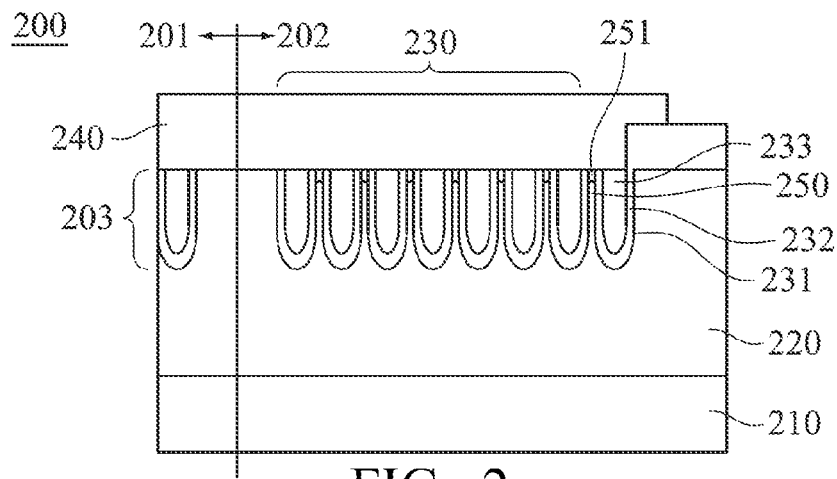
FIG. 2 is a cross-sectional view of a semiconductor device 200 according to an embodiment of the present disclosure.

FIG. 2 is a cross-sectional view of a semiconductor device 200 according to an embodiment of the present disclosure. In FIG. 2, the semiconductor device 200 includes an active area 201 and a termination area 202 adjacent to the active area 201. The termination area 202 has a termination structure including a substrate 210, an epitaxy layer 220, a dielectric layer 232, a conductive material layer 233 and a conductive layer 240.

The epitaxy layer 220 is disposed on the substrate 210, and has a voltage-sustaining region 230. The voltage-sustaining region 230 is disposed near a trench semiconductor unit 203 in the active area 201, and has first trenches 231. According to an embodiment of the present disclosure, the substrate 210 can be a silicon substrate. According to an embodiment of the present disclosure, the epitaxy layer 220 can be a N-type epitaxy layer. According to an embodiment of the present disclosure, widths of the first trenches 231 may be different. According to an embodiment of the present disclosure, the widths of the first trenches 231 may be progressively wider or progressively narrower. According to an embodiment of the present disclosure, widths of trench intervals 250 between the first trenches 231 are different. According to an embodiment of the present disclosure, an arrangement of the trench intervals 250 between the first trenches 231 is progressively sparse or progressively dense.

The dielectric layer 232 is disposed in each of the first trenches 231 and on a portion of the epitaxy layer 220. According to an embodiment of the present disclosure, the dielectric layer 232 is constituted by oxide. According to an embodiment of the present disclosure, the dielectric layers 232 in every two adjacent first trenches 231 are separated from each other by a trench interval 250. According to an embodiment of the present disclosure, each trench interval 250 between the first trenches 231 further includes a doped region 251. According to an embodiment of the present disclosure, the doped region 251 can be P-type doping. The P-type doping can prevent a leakage current from occurring earlier from a periphery, thereby increasing a breakdown voltage.

The conductive material layer 233 is disposed on the dielectric layer 232 in each of the first trenches 231. According to an embodiment of the present disclosure, the conductive material layer 233 is constituted by polysilicon or metal. According to an embodiment of the present disclosure, the dielectric layer 232 and the conductive material layer 233 in the first trenches 231, and the epitaxy layer 220 have a flatten surface. The termination structure also can be implemented with a non-flatten surface. For example, in FIG. 1A, the termination structure further includes the first dielectric layer 134 disposed on the flatten surface constituted by the dielectric layer 132, a conductive material layer 133 and the epitaxy layer 120, in which the first dielectric layer 134 and the dielectric layer 132 can be formed at the same step. The first dielectric layer 134 is disposed on the dielectric layers 132 which are in contact with each other between every two adjacent first trenches 131.

The conductive layer 240 covers the first trenches 231, and is in contact with the conductive material layer 233 and a portion of the epitaxy layer 220, and is electronically connected to the active area 201 and the termination area 202. According to an embodiment of the present disclosure, the conductive layer 240 is a Schottky barrier metal layer.

Figure 3A:
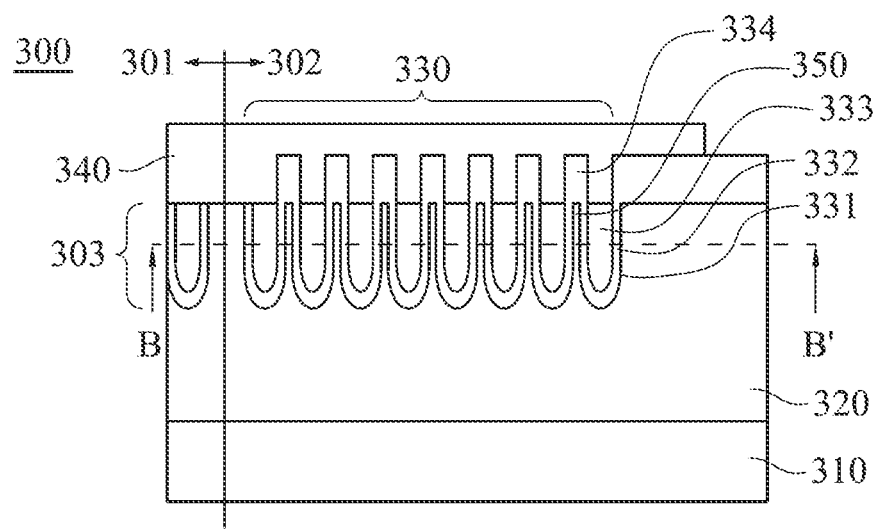
FIG. 3A is a cross-sectional view of a semiconductor device 300 according to an embodiment of the present disclosure.

FIG. 3A is a cross-sectional view of a semiconductor device 300 according to an embodiment of the present disclosure. In FIG. 3A, the semiconductor device 300 includes an active area 301 and a termination area 302 adjacent to the active area 301. The termination area 302 has a termination structure including a substrate 310, an epitaxy layer 320, a dielectric layer 332, a conductive material layer 333 and a conductive layer 340.

The epitaxy layer 320 is disposed on the substrate 310, and has a voltage-sustaining region 330. The voltage-sustaining region 330 is adjacent to a trench semiconductor unit 303 in the active area 301, and has first trenches 331. According to an embodiment of the present disclosure, the substrate 310 can be a silicon substrate. According to an embodiment of the present disclosure, the epitaxy layer 320 can be a N-type epitaxy layer. According to an embodiment of the present disclosure, widths of the first trenches 331 are different. According to an embodiment of the present disclosure, the widths of the first trenches 331 may be progressively wider or progressively narrower. According to an embodiment of the present disclosure, widths of trench intervals 350 between the first trenches 331 are different. Please refer to the FIG. 3C, widths of trench intervals 350a, 350b, and 350c between the first trenches 331 are different. The width of trench interval 350a is larger than the width of trench interval 350b. The width of trench interval 350b is larger than the width of trench interval 350c. According to an embodiment of the present disclosure, an arrangement of the trench intervals 350 between the first trenches 331 is progressively sparse or progressively dense.

The dielectric layer 332 is disposed in each of the first trenches 331 and on a portion of the epitaxy layer 320. According to an embodiment of the present disclosure, the dielectric layer 332 is constituted by oxide. According to an embodiment of the present disclosure, the dielectric layers 332 in every two adjacent first trenches 331 are separated from each other by a trench interval 350.

The conductive material layer 333 is disposed on the dielectric layer 332 in each of the first trenches 331. According to an embodiment of the present disclosure, the conductive material layer 333 is constituted by polysilicon or metal. According to an embodiment of the present disclosure, there is a first dielectric layer 334 on the dielectric layer 332 in each of the first trenches 331 and on a portion of the epitaxy layer 320. The first dielectric layer 334 is disposed above the trench interval 350 between every two adjacent first trenches 331 as shown in FIG. 3A. The first dielectric layer 334 is further expanded above the dielectric layer 332 adjacent to the trench interval 350 according to a process change.

The conductive layer 340 covers the first trenches 331, and is in contact with the conductive material layer 333 and a portion of the epitaxy layer 320, and is electronically connected to the active area 301 and the termination area 302. According to an embodiment of the present disclosure, the conductive layer 340 is a Schottky barrier metal layer.

Figure 3B:
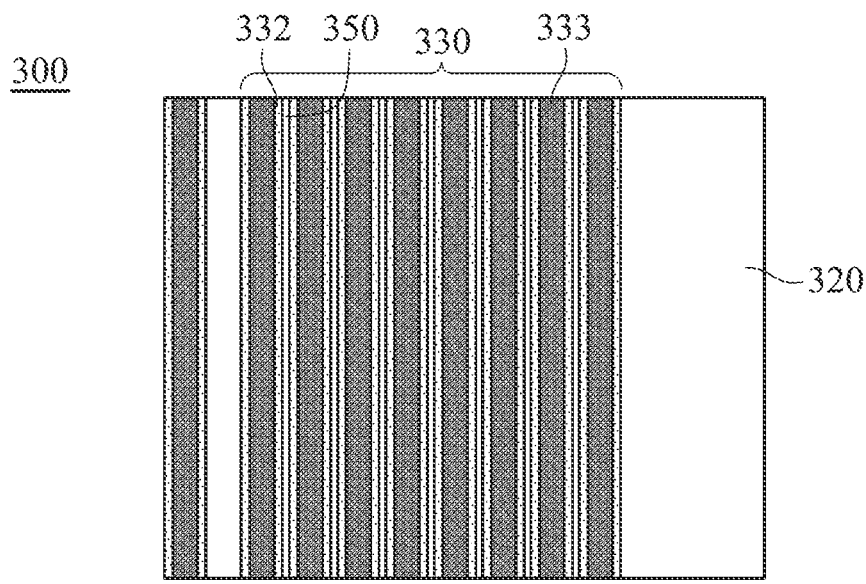
FIG. 3B is a cross-sectional top view of the semiconductor device in FIG. 3A along a cross-sectional line B-B' according to an embodiment of the present disclosure.
Figure 3C:
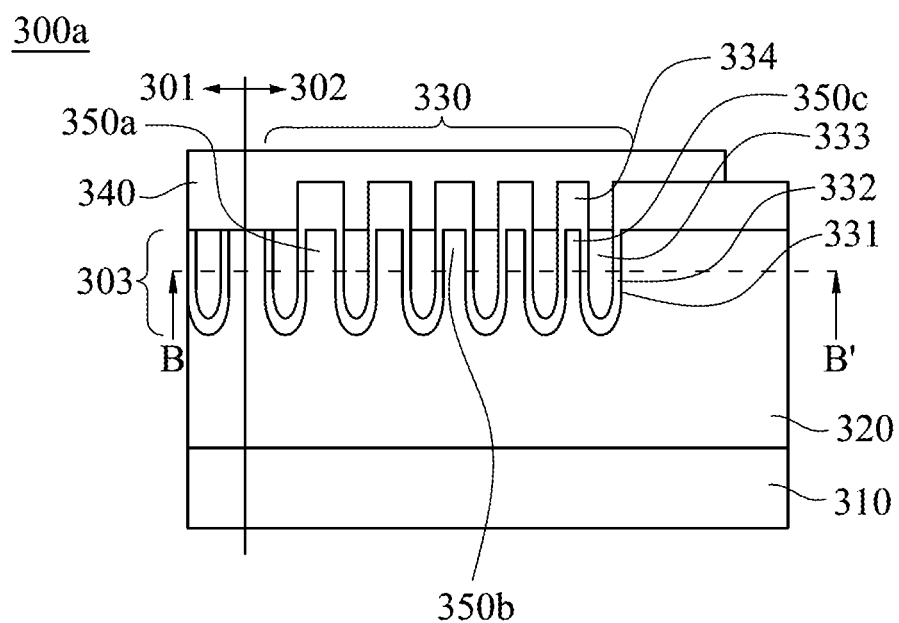
FIG. 3C is a cross-sectional view of a semiconductor device 300a according to an embodiment of the present disclosure.

FIG. 3B is a cross-sectional top view of the semiconductor device in FIG. 3A along a cross-sectional line B-B' according to an embodiment of the present disclosure. In FIG. 3B, the dielectric layer 332 and the conductive material layer 333 are disposed in the first trenches 331, and the trench interval 350 is disposed between every two adjacent first trenches 331.

Figure 4A:
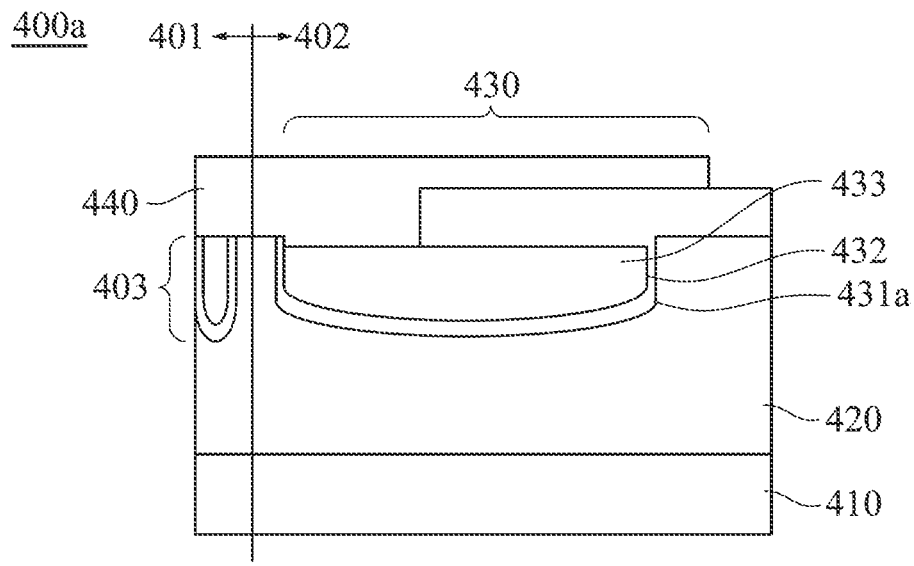
FIG. 4A is a cross-sectional view of a semiconductor device 400a according to an embodiment of the present disclosure.

FIG. 4A is a cross-sectional view of a semiconductor device 400a according to an embodiment of the present disclosure. In FIG. 4A, the semiconductor device 400a includes an active area 401 and a termination area 402 adjacent to the active area 401. The termination area 402 has a termination structure including a substrate 410, an epitaxy layer 420, a dielectric layer 432, a conductive material layer 433 and a conductive layer 440.

The epitaxy layer 420 is disposed on the substrate 410, and has a voltage-sustaining region 430. The voltage-sustaining region 430 is disposed near a trench semiconductor unit 403 in the active area 401, and includes more than one second trenches 431a extending along a direction. According to an embodiment of the present disclosure, the substrate 410 may be a silicon substrate. According to an embodiment of the present disclosure, the epitaxy layer 420 may be a N-type epitaxy layer. According to an embodiment of the present disclosure, the second trenches 431a and the first trenches 331 in FIG. 3A have the same dielectric layer 332 and the conductive material layer 333.

The dielectric layer 432 is disposed in the second trenches 431a and on a portion of the epitaxy layer 420. According to an embodiment of the present disclosure, the dielectric layer 432 is constituted by oxide.

The conductive material layer 433 is disposed on the dielectric layer 432 in the second trenches 431a. According to an embodiment of the present disclosure, the conductive material layer 433 is constituted by polysilicon or metal.

The conductive layer 440 covers the second trenches 431a, and is in contact with the conductive material layer 433 and a portion of the epitaxy layer 420, and is electronically connected to the active area 401 and the termination area 402. According to an embodiment of the present disclosure, the conductive layer 440 is a Schottky barrier metal layer.

Figure 4B:
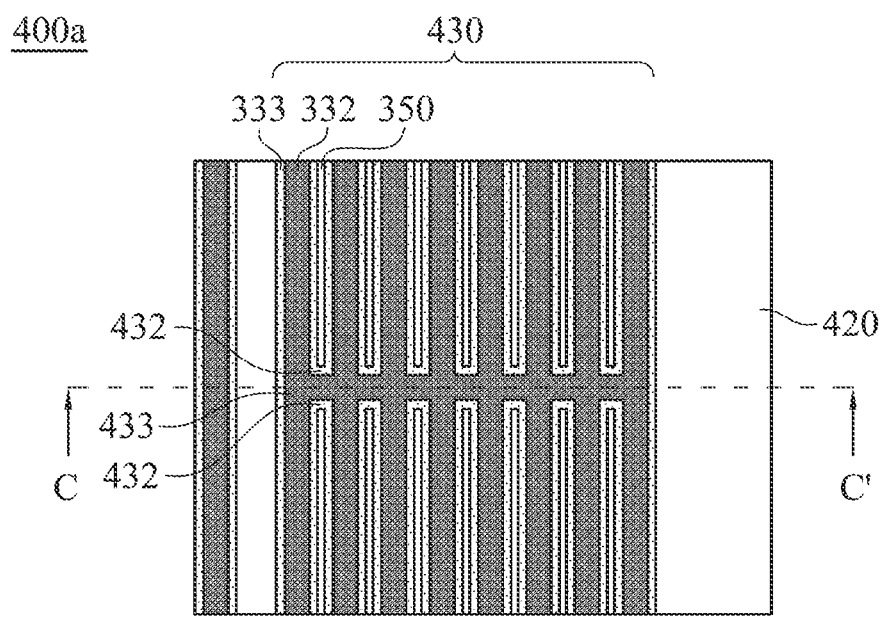
FIG. 4B is a top view of the semiconductor device 400a according to an embodiment of the present disclosure.

FIG. 4B is a cross-sectional top view of the semiconductor device according to an embodiment of the present disclosure. FIG. 4A is a cross-sectional view of FIG. 4B along a cross-sectional line C-C'. In FIG. 4B, the dielectric layer 332 and the conductive material layer 333 are disposed in the first trenches 331 (not labeled). The dielectric layer 432 and the conductive material layer 433 are disposed in the second trenches 431a (not labeled). The voltage-sustaining region 430 of the epitaxy layer 420 in the termination structure has the first trenches 331 and the second trenches 431a. The first trenches 331 extend along a first direction and are parallel with each other. There is a trench interval 350 between every two adjacent first trenches 331. The second trenches 431a extend along a second direction. According to an embodiment of the present disclosure, the first direction of the first trenches 331 is perpendicular to the second direction of the second trenches 431a.

Figure 4C:
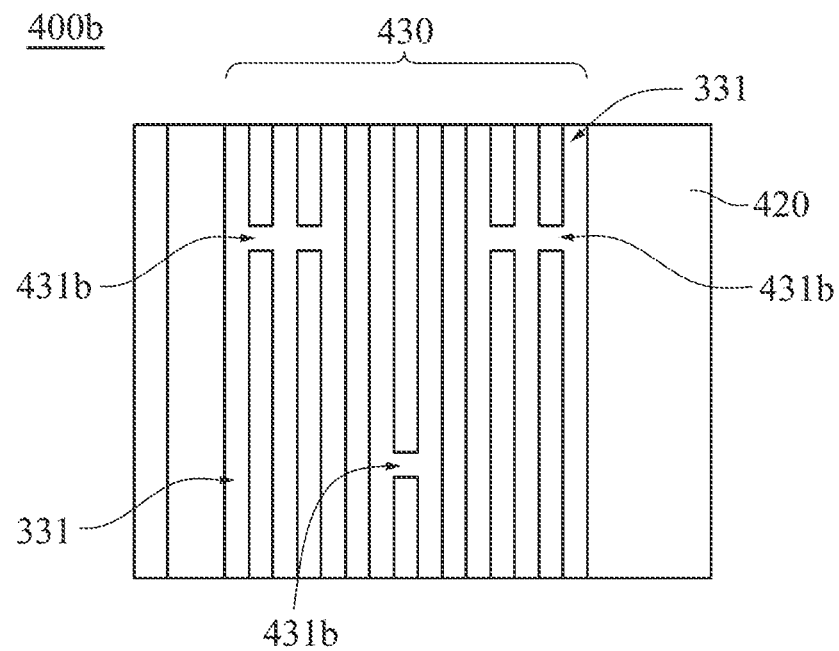
FIG. 4C is a top view of trenches 431b in a semiconductor device 400b according to an embodiment of the present disclosure.

FIG. 4C is a cross-sectional top view of trenches 431b in a semiconductor device 400b according to an embodiment of the present disclosure. In FIG. 4C, the voltage-sustaining region 430 of the epitaxy layer 420 in the termination structure has the first trenches 331 and the second trenches 431b. The first trenches 331 extend along the first direction and are parallel with each other. The second trenches 431b extend along the second direction and are parallel with each other. According to an embodiment of the present disclosure, the first direction of the first trenches 331 is perpendicular to the second direction of the second trenches 431b, and the second trenches 431b may be perpendicular to a portion of the parallel first trenches 331 according to a practical requirement without needing to penetrate all the first trenches 331 as shown in FIG. 4B.

Figure 4D:
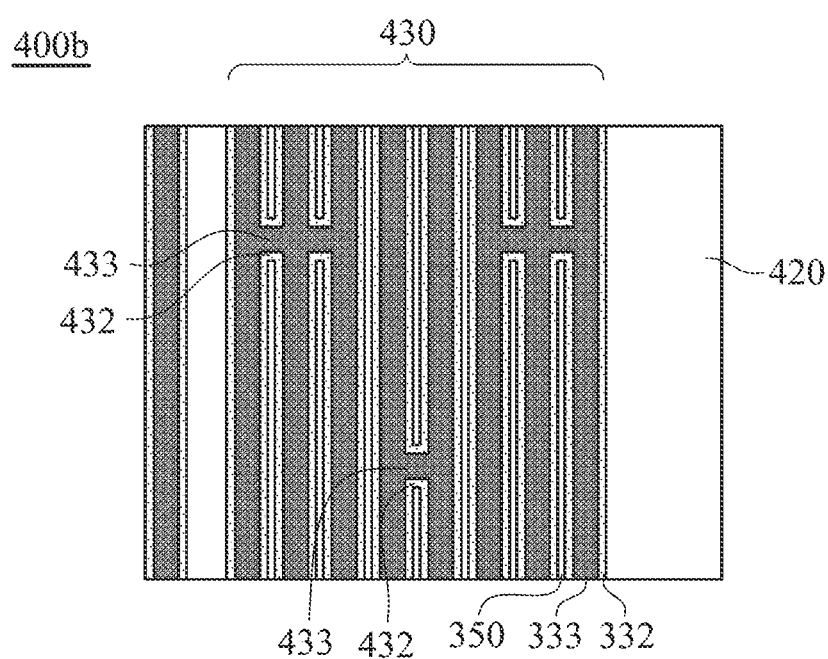
FIG. 4D is a cross-sectional top view of the semiconductor device 400b according to an embodiment of the present disclosure.

FIG. 4D is a cross-sectional top view of the semiconductor device 400b according to an embodiment of the present disclosure, and illustrates a structure above the first trenches 331 and the second trenches 431a in FIG. 4C. In FIG. 4D, the dielectric layer 332 and the conductive material layer 333 are disposed in the first trenches 331. The trench interval 350 is disposed between every two adjacent first trenches 331. The dielectric layer 432 and the conductive material layer 433 are disposed in the second trenches 431b. According to an embodiment of the present disclosure, the dielectric layer 332 and the dielectric layer 432 are formed from the same material, and the conductive material layer 333 and the conductive material layer 433 are formed from the same material. Since a portion of the conductive material layer 333 is perpendicularly connected to the conductive material layer 433 in the embodiment, different withstand voltage structures can be designed according to different withstand voltage requirements.

Figure 5A:
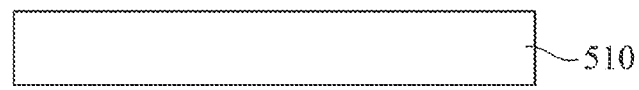
FIG. 5A to FIG. 5J are schematic diagrams illustrating steps for manufacturing the semiconductor device according to an embodiment of the present disclosure.
Figure 5B:
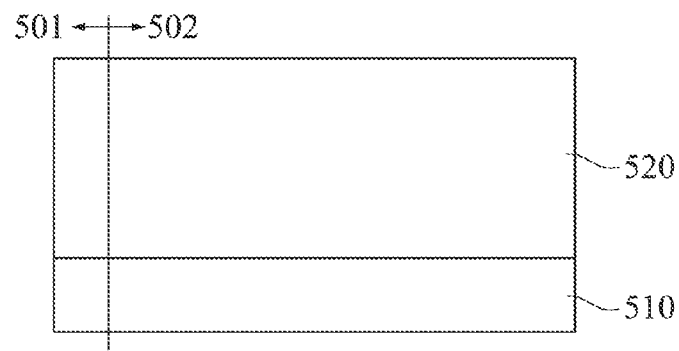

FIG. 5A to FIG. 5J are schematic diagrams illustrating steps for manufacturing the semiconductor device according to an embodiment of the present disclosure. In FIG. 5A, a substrate 510 is provided. According to an embodiment of the present disclosure, the substrate 510 is a silicon substrate. In FIG. 5B, an epitaxy layer 520 is formed on the substrate 510, in which the epitaxy layer 520 is divided into an active area 501 and a termination area 502. The epitaxy layer 520 is formed as a N-type epitaxy layer.

Figure 5C:
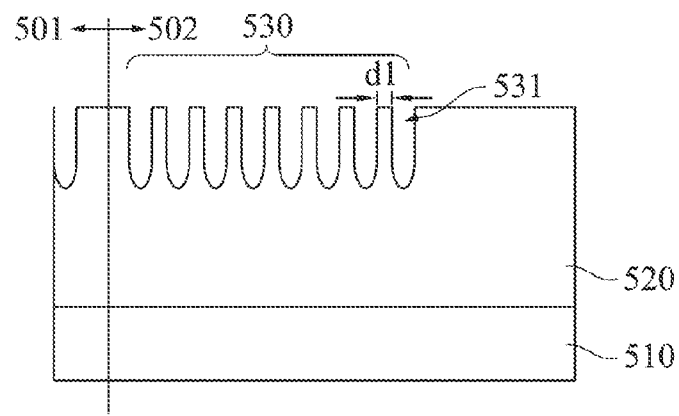
Figure 5D:
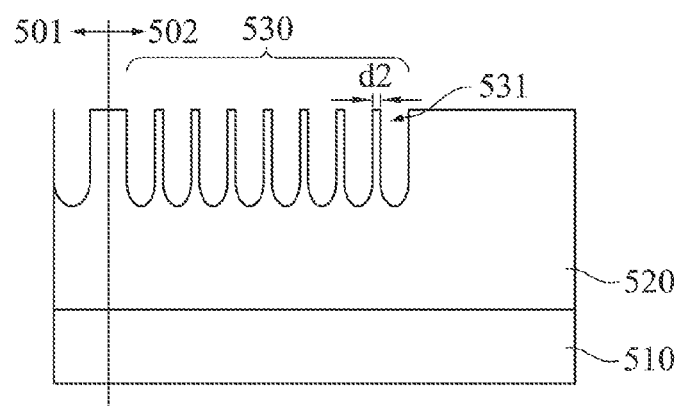

In FIG. 5C, the epitaxy layer 520 has a voltage-sustaining region 530 adjacent to the active area 501. Trenches 531 are formed in the voltage-sustaining region 530, and all of the trenches 531 extend along a first direction. There is a trench interval between every two adjacent trenches 531, and the widths of the trench intervals are d1. According to an embodiment of the present disclosure, the step of forming the trenches 531 includes etching the epitaxy layer 520 to form the trenches 531, and removing an oxide layer over a surface of the trenches 531, as shown in FIG. 5D. After the oxide layer over the surface of the trenches 531 is removed, the width of the trench interval between every two adjacent trenches 531 is d2, in which d2 is smaller than d1.

Figure 5E:
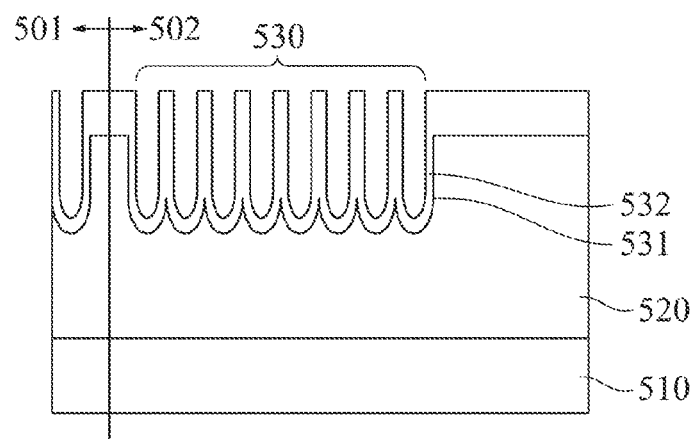

In FIG. 5E, a dielectric layer 532 is formed in each of the trenches 531. According to an embodiment of the present disclosure, the dielectric layers 532 in every two adjacent trenches 531 are in contact with each other.

Figure 5F:
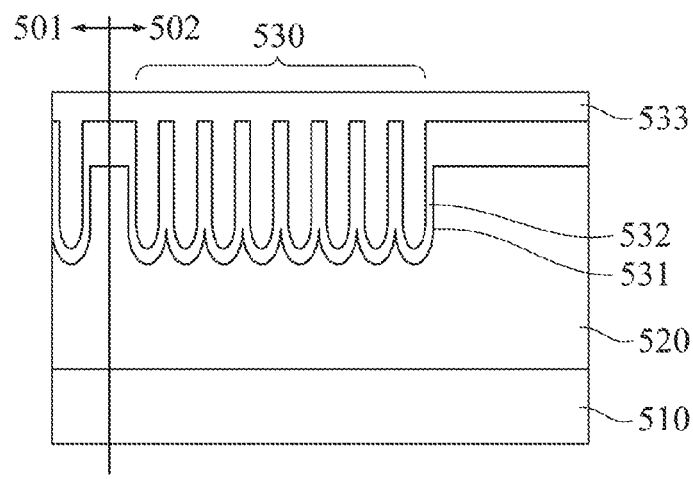
Figure 5G:
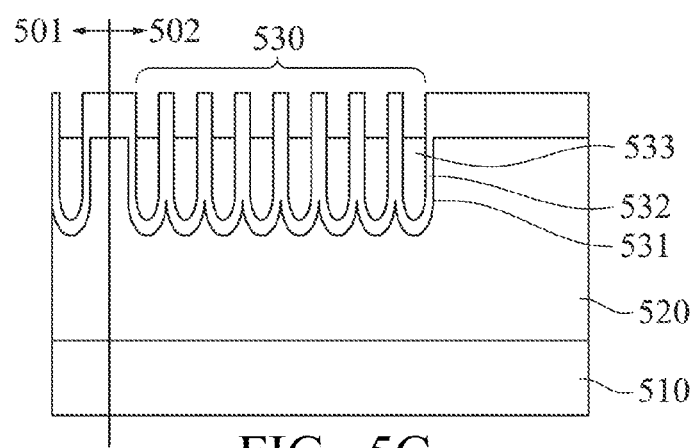
Figure 5H:
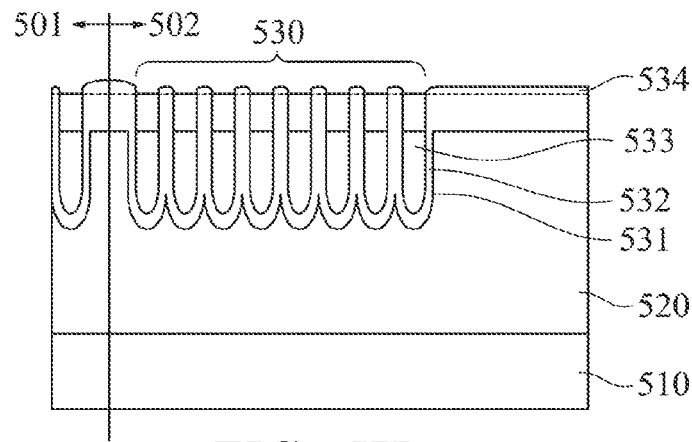
Figure 5I:
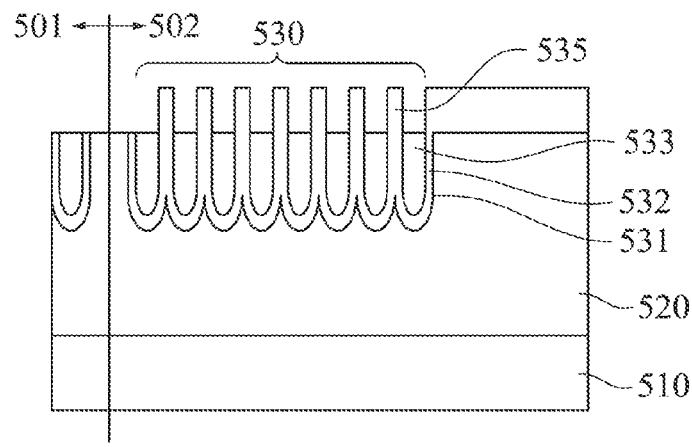

In FIG. 5F, a conductive material layer 533 is formed on the dielectric layer 532 in each of the trenches 531. As shown in FIG. 5G, the step of forming the conductive material layer 533 includes putting in a conductive material to cover the trenches 531; and removing a portion of the conductive material to form the conductive material layer 533 in each of the trenches 531. According to an embodiment of the present disclosure, the method further includes following steps. The second dielectric layer 534 is formed on the epitaxy layer 520, the dielectric layer 532, and the conductive material layer 533 as shown in FIG. 5H. A portion of the second dielectric layer 534 is removed to expose the conductive material layer 533 and a portion of the epitaxy layer 520 as shown in FIG. 5I. According to an embodiment of the present disclosure, a portion of the second dielectric layer 534 is removed to form the first dielectric layer 535 on the dielectric layers 532 in contact with each other in every two adjacent trenches 531.

Figure 5J:
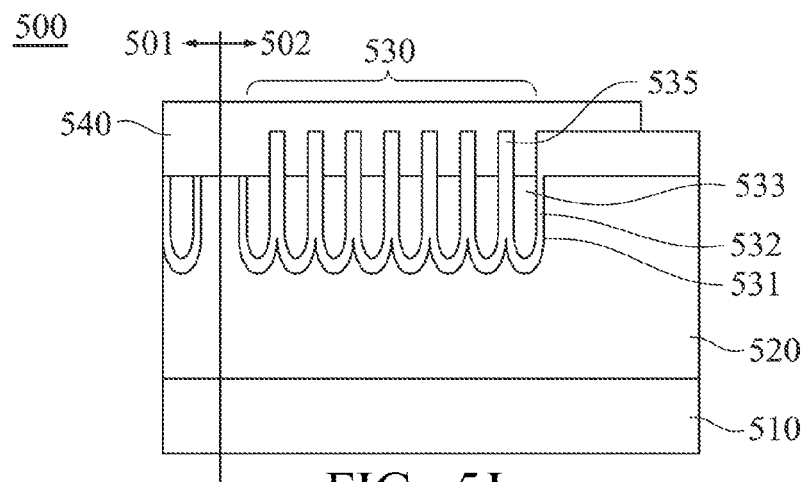

In FIG. 5J, the conductive layer 540 is formed on each of the trenches 531, and the conductive layer 540 is in contact with the conductive material layer 533 and a portion of the epitaxy layer 520. According to an embodiment of the present disclosure, the step of forming the conductive layer 540 is to form a Schottky barrier metal layer.

Figure 6A:
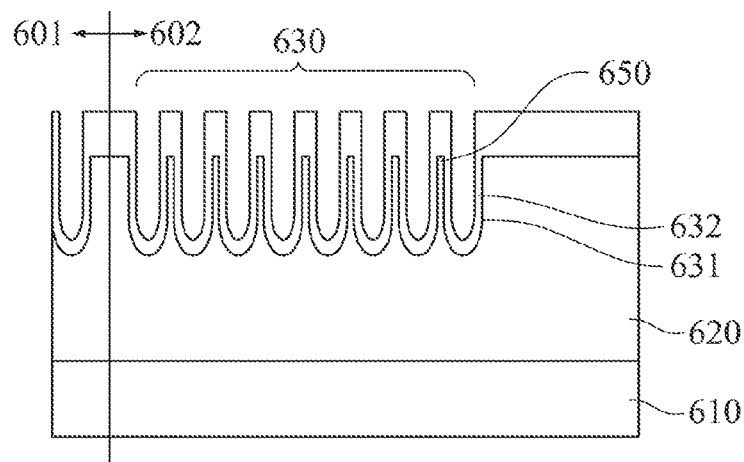
FIG. 6A to FIG. 6F are schematic diagrams illustrating steps for manufacturing the semiconductor device according to an embodiment of the present disclosure.

FIG. 6A to FIG. 6F are schematic diagrams illustrating steps for manufacturing the semiconductor device according to an embodiment of the present disclosure. FIG. 6A is another embodiment following FIG. 5D. In FIG. 6A, a dielectric layer 632 is formed in each of trenches 631. According to an embodiment of the invention, the dielectric layers 632 in every two adjacent trenches 631 are separated from each other by a trench interval 650.

Figure 6B:
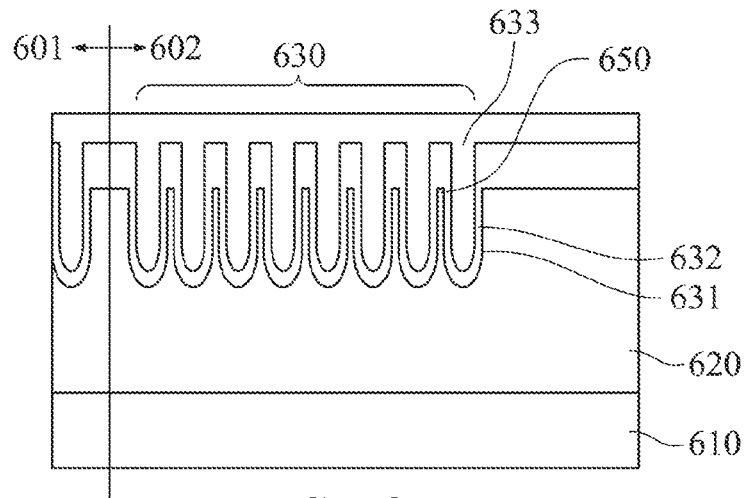
Figure 6C:
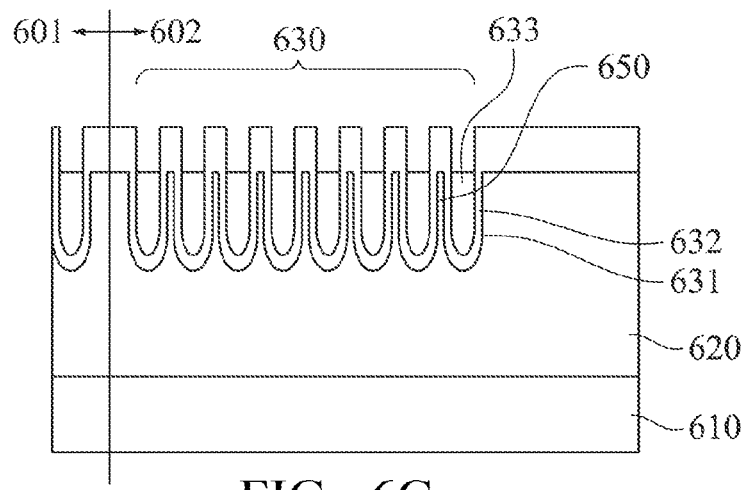
Figure 6D:
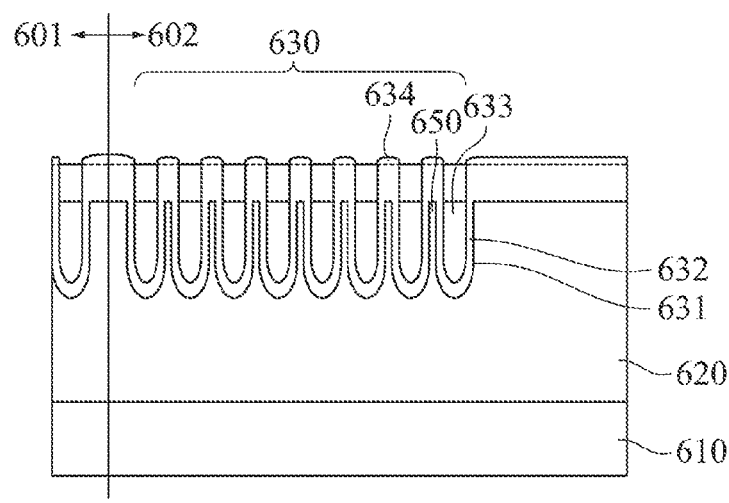
Figure 6E:
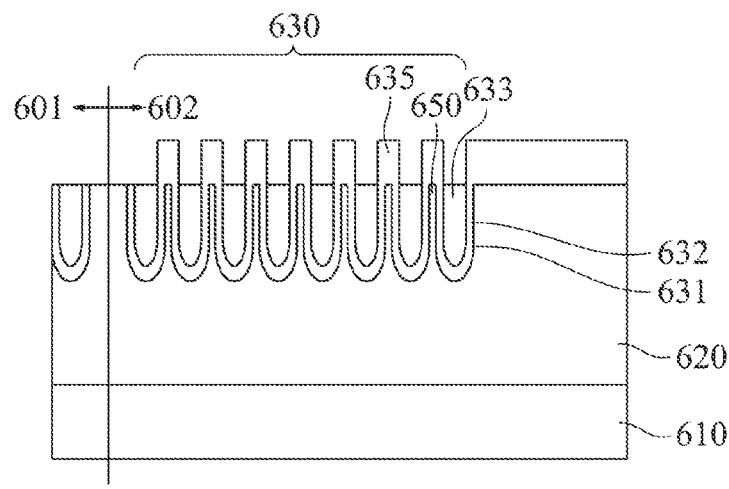

In FIG. 6B, a conductive material layer 633 is formed on the dielectric layer 632 in each of the trenches 631. According to an embodiment of the present disclosure, the step of forming the conductive material layer 633 includes putting in a conductive material to cover the trenches 631; and removing a portion of the conductive material to form the conductive material layer 633 in each of the trenches 631 as shown in FIG. 6C. According to an embodiment of the present disclosure, the manufacturing method further includes the following steps. A second dielectric layer 634 is formed on the epitaxy layer 620, the dielectric layer 632, and the conductive material layer 633. A portion of the second dielectric layer 634 is removed to expose the conductive material layer 633 and a portion of the epitaxy layer 620 as shown in FIG. 6D to FIG. 6E. According to an embodiment of the present disclosure, a portion of the second dielectric layer 634 is removed to form the first dielectric layer 635 on the trench interval 650 between every two adjacent trenches 631. According to an embodiment of the present disclosure, the method further includes enabling the epitaxy layer, the dielectric layer and the conductive material layer to form a flatten surface.

Figure 6F:
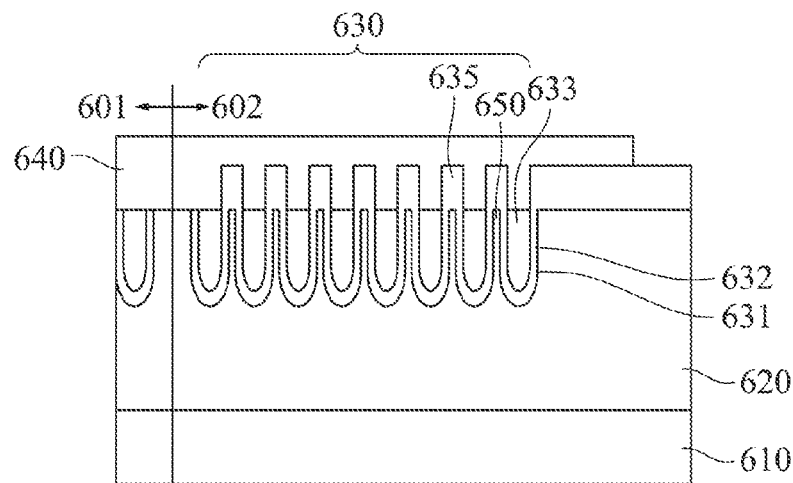

In FIG. 6F, a conductive layer 640 is formed on each of the trenches 631, and the conductive layer 640 is in contact with the conductive material layer 633 and a portion of the epitaxy layer 620. According to an embodiment of the present disclosure, the step of forming the conductive layer 640 is to form a Schottky barrier metal layer.

Figure 7:
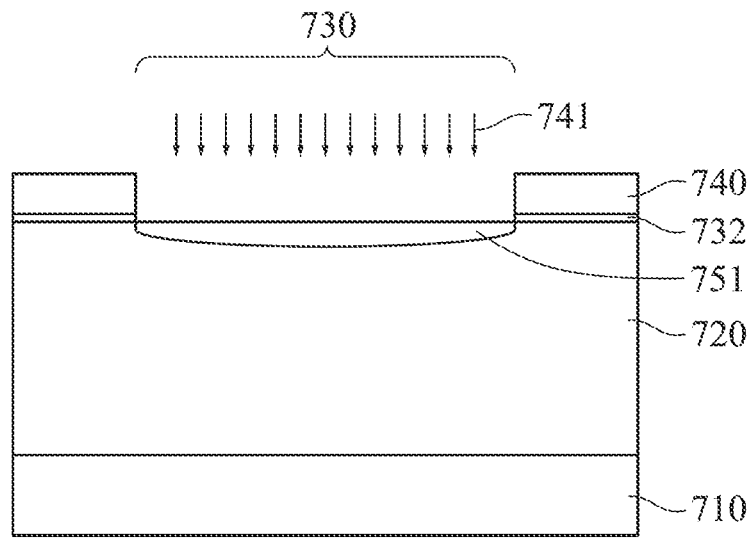
FIG. 7 is a schematic diagram illustrating a step for manufacturing the semiconductor device according to an embodiment of the present disclosure.

FIG. 7 is a schematic diagram illustrating a step for manufacturing the semiconductor device according to an embodiment of the present disclosure. In FIG. 7, the epitaxy layer 720 on the substrate 710 has a voltage-sustaining region 730. An area except the voltage-sustaining region 730 is first covered with a dielectric layer 732 and a photoresist layer 740, and then a doping process 741 is performed. A doped region 751 is formed over the surface of the epitaxy layer 720 by the doping process 741. According to an embodiment of the present disclosure, the doped region 751 is a P-type doped region. According to an embodiment of the present disclosure, the doping process can be performed before the trenches is formed on the epitaxy layer.

Figure 8:
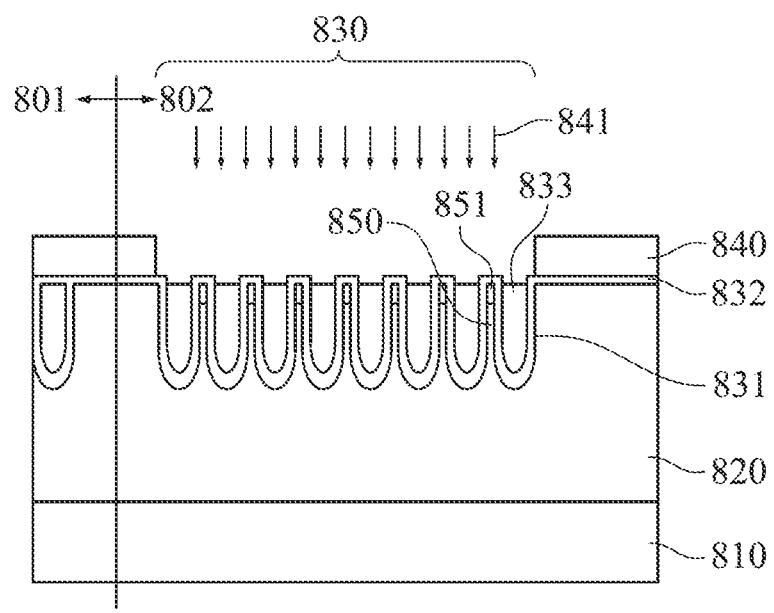
FIG. 8 is a schematic diagram illustrating a step for manufacturing the semiconductor device according to an embodiment of the present disclosure.

FIG. 8 is a schematic diagram illustrating a step for manufacturing the semiconductor device according to an embodiment of the present disclosure. In FIG. 8, an epitaxy layer 820 on a substrate 810 has a voltage-sustaining region 830. Trenches 831, a dielectric layer 832 and a conductive material layer 833 are formed in the voltage-sustaining region 830, in which there is a trench interval 850 between every two adjacent trenches 831. An area except the voltage-sustaining region 830 is first covered by a photoresist layer 840, and then a doping process 841 is performed. A doped region 851 is formed in a trench interval 850 between every two adjacent trenches 831 by the doping process 841. According to an embodiment of the present disclosure, the doped region 851 is a P-type doped region. According to an embodiment of the present disclosure, the doping process is performed before the conductive layer is formed.

In the embodiments of the present disclosure, the termination structure of the semiconductor device includes the trenches in the voltage-sustaining region, and the dielectric layer and the conductive material layer are disposed in each of the trenches. The termination structure provided in the embodiments of the present disclosure can effectively reduce an area of the termination area of the power semiconductor device to reach a goal of miniaturization. On the other hand, since the dielectric layers in the trenches are connected to each other, an area of the dielectric layer is increased through an undulating structure of the trenches so as to have a higher breakdown voltage in a smaller area. Therefore, the termination structure of the semiconductor device provided in the present disclosure can increase the breakdown voltage of a overall unit. In one embodiment of the present disclosure, the breakdown voltage of the termination structure can be increased by more than 10% to 20%, and the area is reduced more than 50%. In the method for manufacturing the termination structure, only three to four photomask processes are required to complete the complicated photomask processes required in the prior art. Therefore, process time is reduced and capacity is increased.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims.

What is claimed is:

1. A termination structure of a semiconductor device, wherein the semiconductor device comprises an active area and a termination area adjacent to the active area, and the termination area has the termination structure, the termination structure comprising:

a substrate;

an epitaxy layer disposed on the substrate, wherein the epitaxy layer has a voltage-sustaining region having a plurality of first trenches, and the first trenches extend along a first direction and are in parallel with each other;

a dielectric layer disposed in each of the first trenches and on a first portion of the epitaxy layer;

a conductive material layer disposed on the dielectric layer in each of the first trenches;

a conductive layer covering the first trenches, being in contact with the conductive material layer and a second portion of the epitaxy layer, and electronically connected to the active area; and at least one second trench extending along a second direction, wherein the second trench has the same dielectric layer and conductive material layer with the first trenches.

2. The termination stricture of claim 1, wherein the dielectric layers in every two adjacent ones of the first trenches are in contact with each other.

3. The termination structure of claim 1, wherein the dielectric layers in every two adjacent ones of the first trenches are separated from each other by a trench interval.

4. The termination structure of claim 3, wherein widths of the trench intervals between the first trenches are different.

5. The termination structure of claim 3, wherein the trench intervals between the first trenches further comprise a doped region.

6. The termination structure of claim 1, wherein the dielectric layer and the conductive material layer of each of the first trenches have a flatten surface.

7. The termination structure of claim 1, further comprising a first dielectric layer, wherein the first dielectric layer is disposed on the dielectric layers which are in contact with each other in every two adjacent ones of the first trenches, or the first dielectric layer is disposed on a trench interval, and the every two adjacent ones of the first trenches are separated from each other by the trench interval.

8. The termination structure of claim 1, wherein the first direction of the first trenches is perpendicular with the second direction of the second trench.

* * * * *